United States Patent
Nishiyama et al.

(10) Patent No.: US 6,853,204 B2
(45) Date of Patent: Feb. 8, 2005

(54) WAFER INSPECTION METHOD OF CHARGING WAFER WITH A CHARGED PARTICLE BEAM THEN MEASURING ELECTRIC PROPERTIES THEREOF, AND INSPECTION DEVICE BASED THEREON

(75) Inventors: Hidetoshi Nishiyama, Higashiyamato (JP); Mari Nozoe, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/208,818

(22) Filed: Aug. 1, 2002

(65) Prior Publication Data

US 2003/0057971 A1 Mar. 27, 2003

(30) Foreign Application Priority Data

Sep. 27, 2001 (JP) ........................................ 2001-295399

(51) Int. Cl.⁷ .............................................. G01N 23/00
(52) U.S. Cl. ....................................... 324/751; 324/765
(58) Field of Search ................................ 324/750–765, 324/96; 250/492.2, 398, 492.22

(56) References Cited

U.S. PATENT DOCUMENTS 4,985,628 A * 1/1991 Horstman .................... 250/310
5,650,616 A * 7/1997 Iketaki ........................ 250/288

FOREIGN PATENT DOCUMENTS

| JP | 59-155941 | 2/1983 |
| JP | 05-258703 | 5/1992 |
| JP | 08-160109 | 12/1994 |
| JP | 11-121561 | 7/1998 |

OTHER PUBLICATIONS

Hidetoshi Nishiyama, Mari Nozoe, Koji Aramaki, Osamu Watanabe and Yoshihiro Ikeda, "Open Contact–Failure Detection of via Holes by using Voltage Contrast", Proceedings of SPIE Reprint, reprinted from Metrology, Inspection and Process Control for Microlithography XV, Mar. 1, 2001, vol. 4344, pp. 12–21.

* cited by examiner

Primary Examiner—Vinh P. Nguyen
(74) Attorney, Agent, or Firm—Reed Smith LLP; Stanley P. Fisher, Esq.; Juan Carlos A. Marquez, Esq.

(57) ABSTRACT

A semiconductor defect inspection device and method for detecting defects of partially finished substrates (semiconductor wafers) for semiconductor devices is provided. The substrate surface is irradiated with a charged particle beam and a voltage contrast image is obtained while the charged voltage is controlled at a desired level, and the electric resistances of the irradiated area from the image are calculated to detect a defect and identify the type of defect. Further, the distribution of electric resistances on the whole surface of the substrate can be quickly worked out. The charged particle beam irradiation conditions are varied in order to bring the charged voltage of the area to a desired value. With this device/method, electric resistances of small portions at desired charged voltages and the corresponding electric resistances are measured in a non-contact manner to determine the type of defect. When this inspection method is applied to the PCB manufacturing process, defects can be detected and remedied at an early stage of the process. Consequently, in the semiconductor devices and other PCB related devices, the defect rate decreases and the productivity increase. Since the defect occurrence rate is reduced, the reliability of semiconductor devices is increased, and the efficiency in developing new products is improved.

7 Claims, 9 Drawing Sheets

RESISTANCE DISTRIBUTION

CHARGED VOLTAGE DISTRIBUTION

OPEN CONTACT DEFECT        LEAKAGE DEFECT

FIG. 11

REFRESH DEFECT

|      | 1201 | 1202 | 1203 | 1204 |
|------|------|------|------|------|
| PVC  | ×    | ○    | ×    | ○    |
| NVC  | ○    | ×    | ×    | ○    |

○ ···· BRIGHT
× ···· DARK

WAFER INSPECTION METHOD OF CHARGING WAFER WITH A CHARGED PARTICLE BEAM THEN MEASURING ELECTRIC PROPERTIES THEREOF, AND INSPECTION DEVICE BASED THEREON

FIELD OF THE INVENTION

The present invention relates to a device for evaluating or inspecting faults of small electronic devices formed on a wafer, and particularly to an inspection method which uses a charged particle beam to make an evaluate or inspect faults of a desired part or the whole surface of an unfinished wafer during a semiconductor device manufacturing process, and an inspection device based thereon.

BACKGROUND OF THE INVENTION

A semiconductor device is manufactured by repeating the process of transferring a pattern to a wafer with a photo mask by lithographic and etching techniques. Between the manufacturing stages, ion implantation takes place to form PN junctions. The processing quality in the various steps of the semiconductor device manufacturing process, including a lithographic processing step, an etching step and an ion implantation step, considerably influences the semiconductor device yield rate. Therefore, in order to improve the yield rate, it is important to early detect or predict any defects and the types of defects so as to feedback the manufacturing condition data.

A particularly important thing in the above-mentioned defect detection process is to detect such defects as via (or contact) hole incomplete contact defects, short-circuit defects, and defects in PN junctions at the bottom of via (or contact) holes. In order to know the type of defect, it is necessary to measure the resistance at a desired voltage. Also, in order to identify the cause of a defect, it is important to measure resistances over a range of voltages. The following two conventional techniques have been used to make such measurements.

One method uses a nano-prober (JP-A-160109/1996). In this method, current-voltage characteristics are measured by bringing a sharp W probe (approx. 0.1 μm point curvature radius) into contact with the sample to apply a voltage to the sample thereby measuring the current flowing between the sample and the probe. However, with the growing trend toward finer patterns, the area to be measured tends to be as small as or smaller than the W probe, which makes measurement very difficult. A possible solution to this problem may be the use of a W probe with a smaller point curvature radius. However, this approach is not realistic because the point is very soft and may deform upon contact with the object or sample. In addition, there are three other problems. The first problem is that if the probe and the sample are made of different materials, particularly at least one of them is a semiconductor, a Schottky junction may occur and a voltage-dependent electric resistance may be generated, which causes incorrect measurements. Secondly, this approach is not suitable for the whole wafer surface because of its slow measuring speed. Thirdly, because the probe touches the sample, the wafer may be contaminated such that the approach is not suitable for an in-line inspection.

Another method is the use of an SEM (scanning electron microscope). The method is disclosed in JP-A-258703/1993, JP-A-121561/1999, proceedings No.2 of the 61$^{st}$ Meeting of the Japan Society of Applied Physics (p.671, 3p-K-4), and the Proceedings of SPIE Vol. 4344 (2001) p.12.

JP-A-258703/1993 discloses a method by which a voltage contrast image of a pattern on a wafer which is obtained using an SEM is compared with that of an adjacent pattern to decide where there is a defect with a different voltage contrast (brightness). Although this inspection method is speedy and suitable for whole wafer surface inspection, a brightness difference between voltage contrast images only suggests a difference in electric resistance and no quantitative data is obtained from this inspection. In addition, depending on the orientation of a PN junction, the junction part, when electrically charged, may have a high resistance, such that it is difficult to determine whether or not there is an incomplete contact defect.

JP-A-121561/1999 discloses a method by which the emission of secondary electrons is controlled by a control electrode in front of a wafer to charge the wafer surface positively or negatively. Whether or not there is a defect is determined from a corresponding voltage contrast image. How the emission of secondary electrons is controlled by the control electrode is disclosed in JP-A-155941/1984. According to JP-A-121561/1999, if the control electrode is adjusted so as to positively charge the wafer, the low-resistance portion of the voltage contrast image is bright and its high-resistance portion is dark; and vice versa (if the wafer is negatively charged.) Although this inspection method is speedy and suitable for whole wafer surface inspection, whether each of the voltage contrast image portions is bright or dark merely suggests whether the resistance is high or low, and the relationship between image brightness and resistance is not indicated quantitatively such that resistance values cannot be calculated. Therefore, it is impossible to confirm, for example, whether the reverse bias resistance value of a PN junction is correct or not. Also this prior art claims that the positively or negatively charged wafer condition can be used to identify the orientation of a PN junction; however, if a highly electrically charged condition is produced by electron beam irradiation, the junction might break down with a resulting drastic drop in resistance. The prior art can not identify the orientation of a PN junction which makes the inspection impossible. According to this prior art, this problem is unavoidable because the charged voltage cannot be measured. Besides, although electric resistances can be calculated by measuring leak currents, it takes time to make such an inspection such that the measurement cannot be made quickly.

A method for calculating electric resistances from voltage contrast image signals is disclosed in p.671, 3p-K-4 of proceedings No.2 of the 61$^{st}$ Meeting of the Japan Society of Applied Physics and the Proceedings of SPIE Vol. 4344 (2001) p.12. The resistance-voltage calculation would be impossible with the prior art described in JP-A-258703/1993 or JP-A-121561/1999. However, this method focuses on inspection under a positively charged condition and no reference is made to inspection under a negatively charged condition. Furthermore, even under a positively charged condition, only the resistance at a specific voltage can be measured but the specific voltage is unknown. Therefore, it is impossible to calculate the resistance-voltage characteristics of an electronic device such that it is difficult to identify the type of defect. Another problem is that since the charged voltage cannot be controlled and measured, a breakdown of a PN junction cannot be avoided.

On the other hand, the method which uses a nano-prober has the following problems. One is that the object to be measured may be smaller than the point of the probe. A second problem is that in some kind of sample, an electric resistance cannot be estimated accurately due to the contact resistance between the probe and the sample. Another problem is that a long inspection time is required and that the whole wafer surface inspection is impossible.

In most of the SEM-based inspection devices, a resistance value is relatively evaluated from voltage contrast image signal data. Some SEM-based devices use a method by which an electric resistance is determined from voltage contrast image signal data. However, in both methods, an inspection is made at a specific charged voltage level such that a breakdown may occur due to a high electrostatic with a resultant decline in defect detection sensitivity. Also it is impossible to calculate the electric characteristics (resistance-voltage) of an electronic device and to identify the type of defect. In another method in which resistance values are calculated by measuring leak currents, an inspection is made under a specific charged voltage condition and it takes time to make such an inspection; in other words, an inspection cannot be made quickly and the whole surface of a wafer can hardly be inspected.

The present invention has been made to solve the above problems by providing an inspection method and an inspection device which enable defect detection under a controlled charged voltage condition, permit calculation of resistance-voltage characteristics of electronic devices and quickly find out electric characteristic distribution on the whole wafer surface as well as defect distribution by type.

SUMMARY OF THE INVENTION

In order to solve the above problems, we have decided to use an SEM which has a charged voltage measuring function. Here we take an electron beam by example but an electron beam need not be necessarily used as far as a charged particle beam is used. The required techniques are techniques to measure resistances and charged voltages and control the charged voltage. First, a wafer on which an electronic device is formed is irradiated with an electron beam and secondary electrons or back scattering electrons emitted from it are detected to obtain a voltage contrast image signal. Because the signal is resistance-dependent, the resistance of the electronic device can be calculated. Here, the measured charged voltage represents the voltage applied to the electronic device. The charged voltage can be controlled by feedback of the measured charged voltage data to electron beam condition data. The electron beam condition data include the following factors: beam irradiation area, beam energy and electric potential distribution between the wafer and the electrode around the wafer. The charged voltage can be altered by varying these factors. The inventors of the present invention have found for the first time that calculation of resistances under a controlled charged voltage condition, and calculation of resistance-voltage relations can be incorporated to find out semiconductor defects.

In summary, the present invention provides an inspection method and an inspection device which are characterized as follows. The semiconductor defect inspection method includes the steps of scanning a specific area on a to-be-inspected object with a charged particle beam; measuring at least one of secondary electrons and back scattering electrons emitted from the specific area; calculating a charged voltage of the specific area based upon the measured result, and calculating a corresponding electric resistance value based upon the measured result and an electric current value of the charged particle beam; and comparing a charged voltage vs. electric resistance characteristic pattern of the to-be-tested object being composed of the changed voltage and the corresponding electric resistance value with a charged voltage vs. electric resistance characteristic pattern of at least one type of defect to determine whether the type of defect exists in the specific area. The semiconductor defect inspection device includes deciding means for deciding irradiation conditions of a charged particle beam which include an electric current value of the charged particle beam; scanning means for scanning a specific area on a to-be-inspected object with the charged particle beam; measuring means for measuring an electron count and an energy level of at least one of secondary electrons and back scattering electrons emitted from the specific area; calculation means for calculating a charged voltage of the specific area based upon the energy level, and for calculating a corresponding electric resistance value based upon the electron count and the electric current value of the charged particle beam; and comparing means for comparing a charged voltage vs. electric resistance characteristic pattern of the to-be-tested object being composed of the changed voltage and the corresponding electric resistance value with the charged voltage vs. electric resistance characteristic pattern of the type of defect to determine whether the type of defect exists in the specific area.

BRIEF DESCRIPTION OF THE DRAWINGS

The invention is more particularly described with reference to the accompanying drawings, in which.

DETAILED DESCRIPTION OF THE PREFERRED EMBODIMENTS

The principles of the method and device according to the present invention are explained below.

(1) Method for Calculating a Resistance Value from a Voltage Contrast Image Signal As an incident electron beam is cast on the wafer, it emits secondary electrons and back scattering electrons. Depending on the amount of these emitted electrons, the area irradiated with the electron beam becomes positively or negatively charged. For further information, refer to L. Reimer, "Scanning Electron Microscopy," Springer-Verlag Berlin Heidelberg, 1998. The emission electron count varies according to the degree of the charge so as to obtain a voltage contrast image. There are two types of voltage contrast images: positive voltage contrast (PVC) and negative voltage contrast (NVC). The respective methods are described below.

PVC

Figure 2:
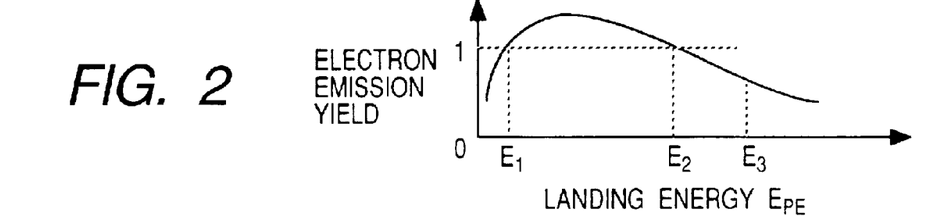
FIG. 2 shows the dependency of electron emission yield on incident electron beam energy.
Figure 3:
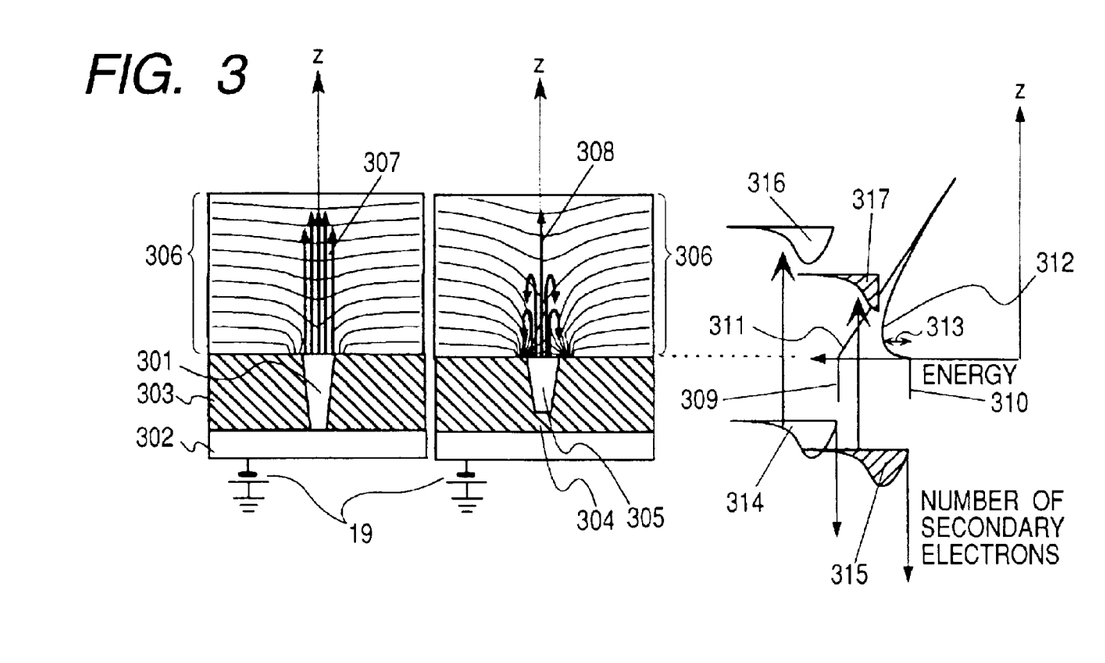
FIG. 3 illustrates a potential distribution in the wafer neighborhood, an emission of secondary electrons and a formation of a potential barrier, as a result of the irradiation with a beam.

For further information on the method for calculating a resistance value from a PVC image, please refer to the Proceedings of SPIE Vol.4344 (2001) p. 12. The following is a brief outline of the method. FIG. 2 shows the dependency on landing electron beam energy $E_{PE}$ of electron emission yield as the ratio of emission or outgoing electron count (sum of secondary electrons and back scattering electrons) to incoming electron count. Here it is assumed that the electron emission yield is 1 when $E_{PE}$ is E1 and E2. If the electron emission yield is larger than 1, the area irradiated with the electron beam is positively charged while if it is smaller than 1, the area is negatively charged. While $E_{PE}$ is between E1 and E2, the electron emission yield is larger than 1 such that the area irradiated with the electron beam is positively charged. This positive voltage pulls back secondary electrons once emitted. The energy of back scattering electrons is sufficiently high such that they are never pulled back. Hence, back scattering electrons are ignored in the following discussion. This phenomenon is illustrated in FIG. 3. As an example, a wafer in which a $SiO_2$ film 303 is formed on a Si substrate 302 and Si plugs are embedded in via (or contact) holes 301 and 305 (as shown on the left in FIG. 3) There is a remaining $SiO_2$ film 304 between the via (or contact) hole 305 and the Si substrate 302. –Vr (<0)[V] as a retarding voltage 19 is imposed on the wafer in order to decelerate the incoming electron beam with a high energy. If that the via (or contact) hole 301 is irradiated with an electron beam 34, since the electron emission yield is larger than 1, there is a positive voltage accumulation in the via (or contact) hole 301. However, since the via (or contact) hole 301 is connected with the Si substrate 302, the resistance is low enough such that electrons are supplied from the earth. As a consequence, the positive voltage is immediately neutralized, and the via (or contact) hole is not electrically charged. Therefore, the generated secondary electrons 307 are all emitted. If there is a remaining film 304, the resistance is high, and few electrons are supplied from the earth, the via (or contact) hole is positively charged. The positive voltage is a barrier to negatively charged secondary electrons. The result is a spatial potential distribution 306 where the secondary electrons with a low kinetic energy are pulled back and the number of the secondary electrons 308 which are emitted or not pulled back decreases. As a consequence, the voltage contrast image signal is large in the low-resistance portion and small in the high-resistance portion.

This process is explained referring to the potential energy diagram for secondary electrons emission on the right in FIG. 3. The vertical axis represents the distance from the wafer and the horizontal axis represents energy. Before the electron beam irradiation, the vacuum level of the via (or contact) holes is represented by 309, and the potential distribution in front of them is represented by 311. When an electron beam is cast on the via (or contact) hole 301 whose resistance is low enough, the energy distribution 314 of the generated secondary electrons continuously ranges from the vacuum level 309 to the high energy side. In this case, since the resistance of the via (or contact) hole is low enough, it does not become electrically charged, and the vacuum level 309 and the potential distribution 311 remain unchanged. This means the absence of a potential barrier to the secondary electrons; therefore, the energy distribution 316 of emitted secondary electrons is the same as the energy distribution 314 of secondary electrons. In contrast, when an electron beam is cast on the via (or contact) hole 305 with a high resistance, the via (or contact) hole becomes positively charged, and a decrease in vacuum level as indicated by 310 occurs. The position of the generated secondary electrons 315 is shifted downward by the amount equivalent to the charged voltage. As a consequence, the potential distribution is like the one as indicated by 312, resulting in forming a potential barrier 313. Due to this barrier, among the secondary electrons once generated, low energy ones are pulled back and only the rest of secondary electrons 317 are emitted. As a consequence, the voltage contrast image signal is large in the low-resistance portion and small in the high-resistance portion.

NVC

If $E_{PE}$ is rather large, for example, when $E_{PE}$ is E3 in FIG. 2, there is a relation of σ<1 (σ expresses an electron emission yield) and the area irradiated with the electron beam becomes negatively charged. This decreases $E_{PE}$ such that $E_{PE}$ and the electron emission yield become closer to E2 and 1, respectively. If the resistance is high enough, when the electron emission yield is 1, namely, E2–E3 [V] is reached, the charged voltage is stabilized. If the resistance is low, due to leak current, the voltage is stabilized before E2–E3 [V] is reached, and the electron emission yield is smaller than 1 and larger than σ. In this way, a larger number of electrons are emitted at higher resistance areas and a smaller number of electrons are emitted at lower resistance areas. In other words, the voltage contrast image signal is large in the high-resistance areas and small in the low-resistance areas.

Figure 15:
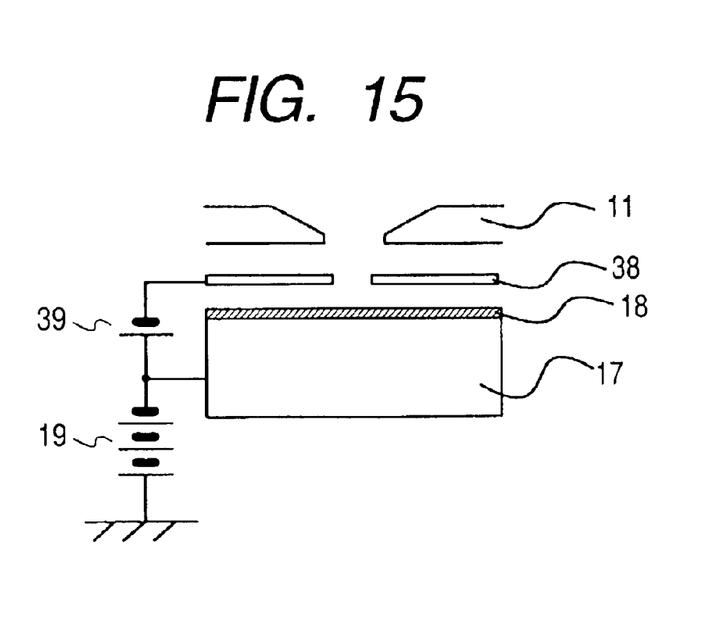
FIG. 15 shows the structure of a charge control electrode used in a fifth embodiment of the present invention.

Even if the electron emission yield is larger than 1, a negatively charged condition can be produced. As illustrated in FIG. 15, the procedure to produce it is to apply a charge control voltage 39 to a charge control electrode 38 installed in front of the wafer to produce a negative potential with respect to the wafer. In this structure, the low-energy component of secondary electrons cannot pass through the charge control electrode 38 and is returned to the wafer so as to decrease the electron emission yield. As a result, the number of electrons emitted from the low-resistance areas decreases, while the high-resistance areas are negatively charged by returned electrons and the electric potential goes down to around the charge control voltage 39. At this time, as the energy of the secondary electrons increases, the number of electrons which pass through the charge control electrode 38 increases. In other words, the voltage contrast image signal is large in the high-resistance areas and small in the low-resistance areas. However, as the returned electrons are diffuse, it takes time for the high-resistance areas to become negatively charged. As a means for shortening the time, it is effective that a magnetic field is vertically applied to the wafer to concentrate the returned electrons.

Figure 4:
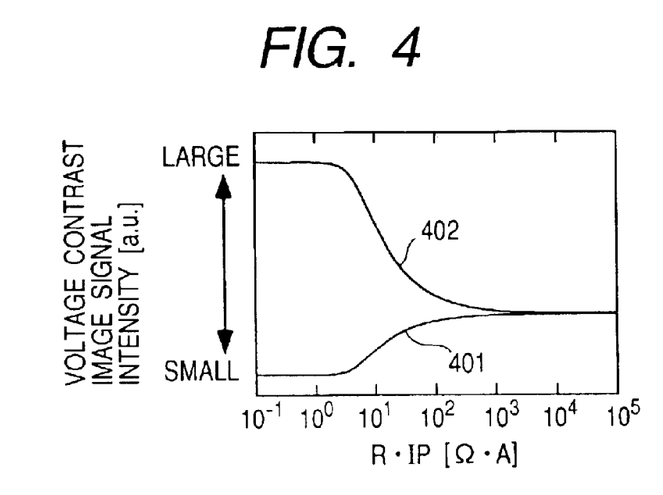
FIG. 4 shows the resistance dependency of voltage contrast image signal.

When these phenomena are taken quantitatively, the relation as shown in FIG. 4 exists between the resistance and the number of detected emission electrons. Here, the horizontal axis represents the product of resistance R and current IP of the beam which irradiates the sample, and the vertical axis represents the intensity (electron count) of the voltage contrast image signal. The curve 401 represents a case of PVC and the curve 402 represents a case of NVC. The result for NVC is demonstrated here for the first time by the inventors in the present invention. In both cases, the brightness range is 0<log (R·IP)<3. In this way, the resistance value can be calculated from the voltage contrast image signal.

(2) Method for Measuring the Charged Voltage

Charged voltage measurement can be done using, for example, an energy filter (sometimes called an energy analyzer) to measure the energy of the secondary electrons or back scattering electrons. This is because in a positively or negatively charged wafer, the energy of the secondary electrons and back scattering electrons also changes according to the charged voltage. For further information on energy filters, please refer to L. Reimer, "Scanning Electron Microscopy," Springer-Verlag Berlin Heidelberg, 1998, p.197. One example of an energy filter system is a structure that a metal mesh plate, which functions as an energy filter, is installed in front of a detector for detecting secondary electrons or back scattering electrons. A voltage is applied to the metal mesh, and the voltage is varied. This varies the probability of secondary electrons or back scattering electrons passing through the metal mesh. The wafer charged voltage can be measured by measuring this variation with the detector.

Figure 17:
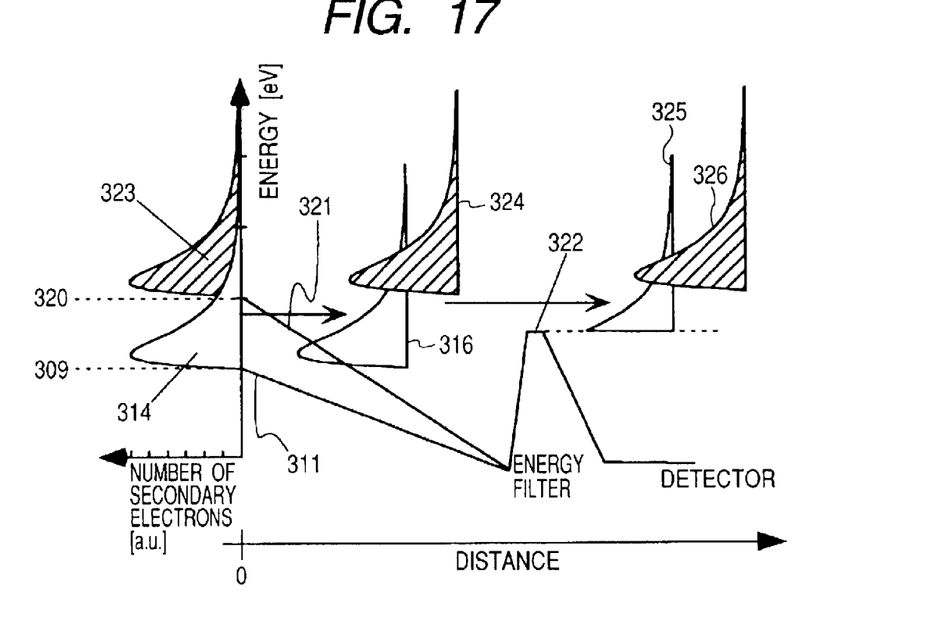
FIG. 17 shows the principle of charged voltage measurement using an energy filter.
Figure 18:
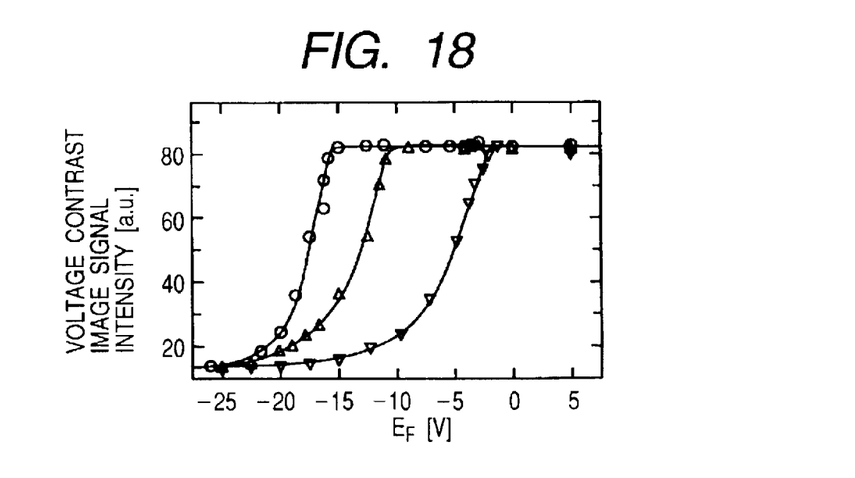
FIG. 18 shows an example of charged voltage measurement using the energy filter.

The principle of measurement is illustrated in detail in FIG. 17. Although the charged voltage calculating process is described based on the measurement of secondary electrons, the process based on the measurement of back scattering electrons is substantially the same. In FIG. 17, how secondary electrons are emitted is shown in the form of a potential energy diagram. The horizontal axis represents the distance from the wafer, and the vertical axis represents the energy. The position of the wafer is assumed to be zero distance. Before charging, the vacuum level is expressed by 309, and the potential distribution in front of the wafer is expressed by 311. Usually a negative voltage as a retarding voltage is applied to the wafer such that the vacuum level 309 is higher than 0 eV. When the wafer is irradiated with an electron beam, secondary electrons 314 are generated, and secondary electrons 316 are emitted into the vacuum. In this figure, all secondary electrons are expressed in energy distributions. When the electron emission yield is smaller than 1 and the wafer is negatively charged, the wafer's vacuum level goes up from the level 309 to the level 320, and the potential distribution is expressed by 321. When the wafer is positively charged, the situation is opposite to the above-mentioned. The energy distribution of the secondary electrons generated under a negatively charged condition is expressed by 323 and secondary electrons emitted into the vacuum are expressed by 324. In the energy filter, the energy of the secondary electrons 316, 324 emitted into the vacuum is measured to determine the charged voltage. As a voltage is applied to the energy filter, a potential barrier 322 is formed. If its voltage is low, it works as a barrier to the secondary electrons such that the number of detected electrons 325, 326 decreases. FIG. 18 shows the relation between the energy filter voltage EF and the number of electrons passing through the filter (which are detected by the detector). The voltage level at which the signal begins to go down is equal to the charged voltage. In this case, the charged voltages are −2 V, −10 V and −15 V. The explanation made so far assumes that the wafer is negatively charged, but the same is true if it is positively charged. As can be understood from the above explanation, charged voltage measurement can be made in this way.

(3) Method for Varying and Controlling the Charged Voltage

Figure 5:
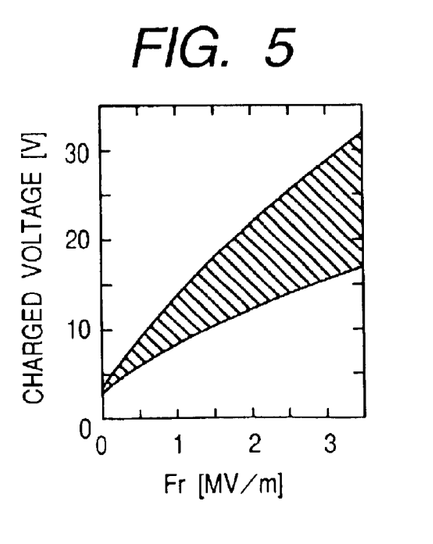
FIG. 5 shows the dependency of a charged voltage on the electrical field.
Figure 6:
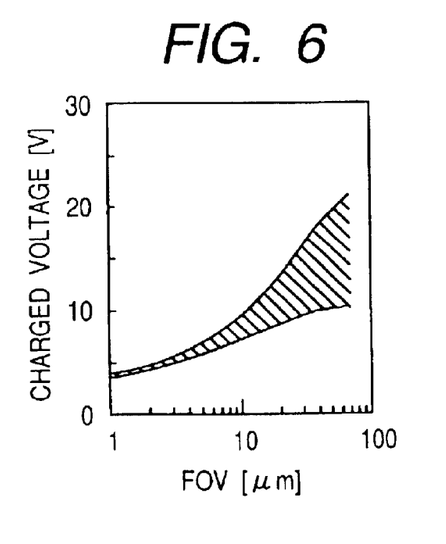
FIG. 6 shows the dependency of a charged voltage on the field of view (FOV)
Figure 16:
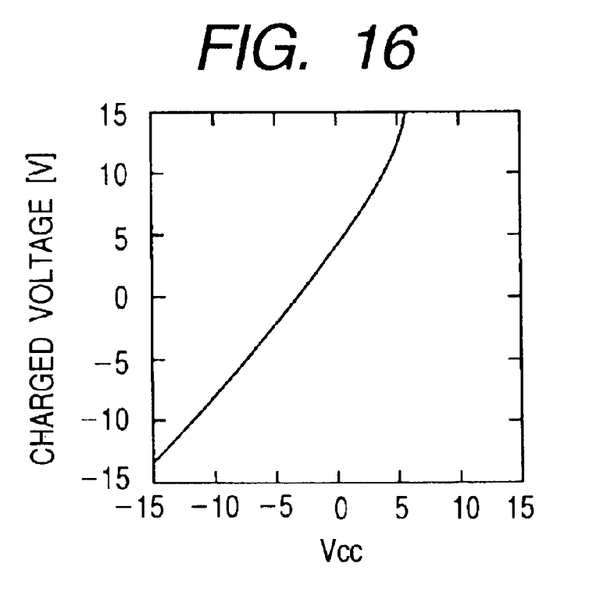
FIG. 16 shows the charge control voltage dependency of the charged voltage according to the fifth embodiment.

The charged voltage can be varied by varying the electron beam irradiating conditions (ex. a beam irradiation area, a beam energy, and a potential distribution in the wafer neighborhood). For instance, if an electron beam with a landing energy of 500 eV is used, it is possible to vary the charged voltage by varying the beam irradiation area (FOV, field of view) and the electrical field in the wafer neighborhood, as shown in FIGS. 5 and 6. Here, the fact that there is a range of charged voltages suggests that the charged voltage varies according to the range of electron beam irradiation. As another example, as shown in FIG. 15, a charge control electrode 38 to which a charge control voltage 39 applied is installed in front of the wafer to vary the potential in the wafer neighborhood. When a positive voltage with respect to the wafer is applied to the charge control electrode 38, the emission of secondary electrons is facilitated, resulting in an increase in the charged voltage. When a negative voltage with respect to the wafer is applied to the charge control electrode 38, the return of secondary electrons occurs, resulting in a decrease in the charged voltage. FIG. 16 shows an example of actual measurement. The graph demonstrates that the charged voltage is controlled by varying the charge control voltage 39 (Vcc).

In this way, the charged voltage is controlled by manipulating the tendency of changes in charged voltage with variation in electron beam irradiating conditions. For example, in order to make the voltage of a certain area 10 V, even when it is charged to 20 V by electron beam irradiation, the charged voltage can be decreased by weakening the electrical field in the wafer neighborhood. The charged voltage is thus controlled by sending an adequate instruction to the electron beam irradiation controller. Accordingly, a combination of the above-mentioned methods (1), (2) and (3) makes it possible to calculate resistance-voltage characteristics and to measure resistances with the charged voltage kept at a desired level.

Embodiment 1

Figure 7:
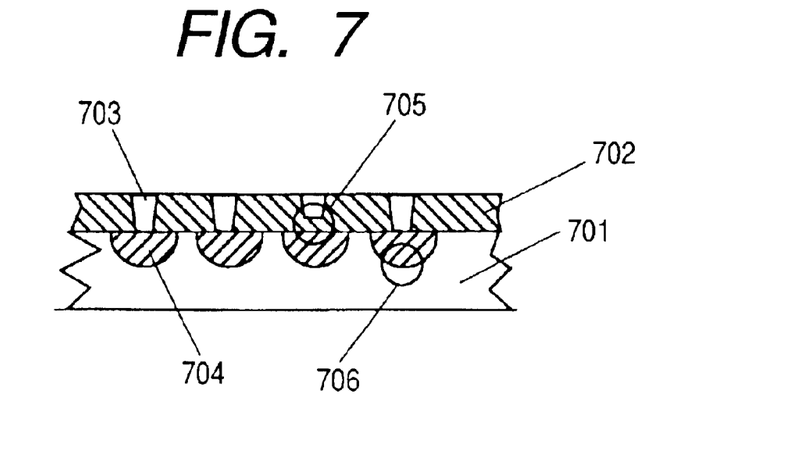
FIG. 7 shows a cross section of a wafer.

This embodiment refers to a method by which the resistance-voltage characteristics of a sample are quickly measured in a non-contact manner so as to identify the types of defects. FIG. 7 shows a cross section of the wafer used here. It consists of a Si substrate 701, a $SiO_2$ film 702, via (or contact) holes with an embedded poly-silicon plug 703, n-diffusion layers 704 beneath the via (or contact) holes, and PN junctions 706 formed by the diffusion layers 704. It also has an incomplete contact defect 705.

Figure 1:
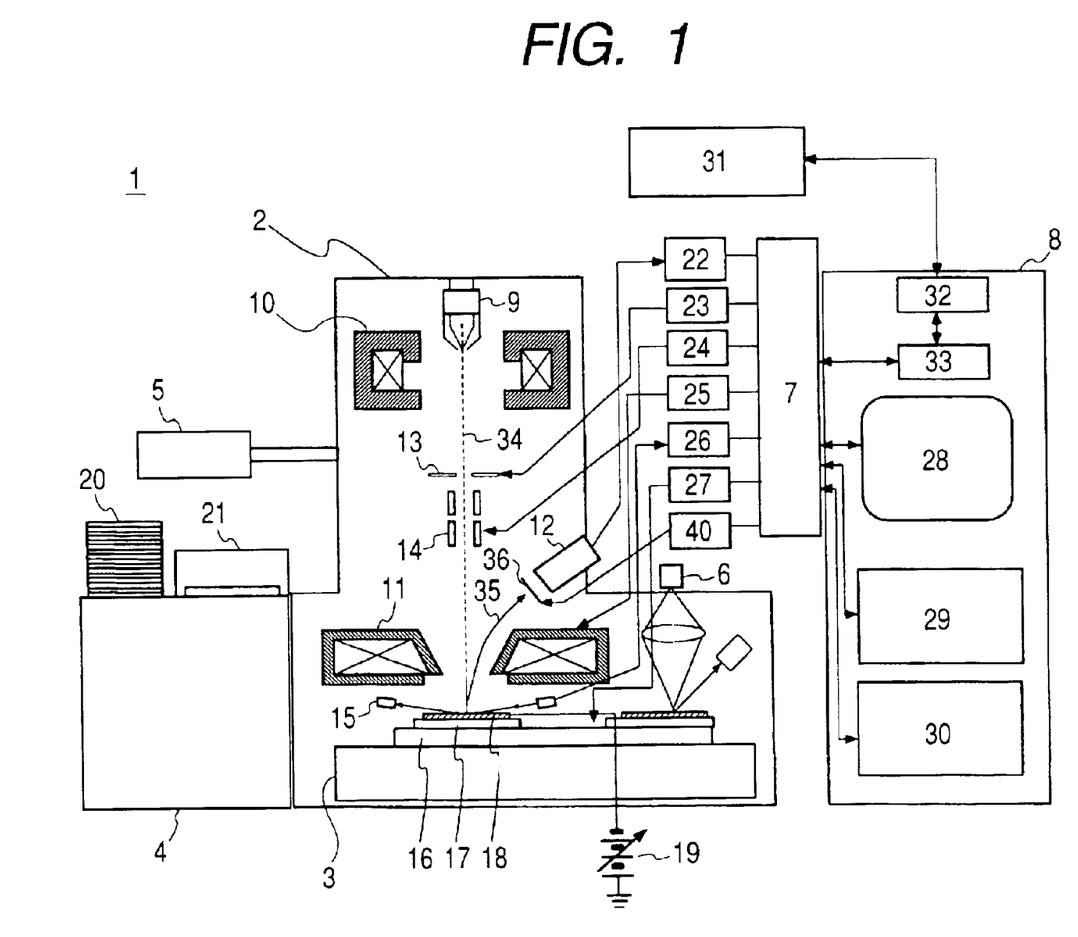
FIG. 1 shows an inspection device.

FIG. 1 shows the structure of a semiconductor device inspection device according to this embodiment. The semiconductor device inspection device 1 is mainly composed of an electron optics system 2 (i.e., an inspection chamber), a stage mechanism 3, a wafer transportation system 4, an evacuation system 5, an optical microscope 6, a control system 7 and a control section 8.

The electron optics system 2 consists of an electron gun 9 for emitting an electron beam 34, a condensing lens 10 and an objective lens 11 which focus the electron beam on a wafer 18, a blanking control electrode 13 for blanking the electron beam 34 (thereby preventing the wafer from being irradiated), a deflector 14 for scanning the wafer 18 with the electron beam 34, a wafer height sensor 15 for detecting the height of the wafer, a detector 12 for detecting emission electrons (secondary electrons and back scattering electrons) 35 generated on the wafer 18, and an energy filter 36 installed in front of the detector. In order to obtain a voltage contrast image of the wafer 18, the electron beam 34 is highly focused on the wafer 18 so as to generate emission electrons 35 and these electrons are detected synchronously with the scanning of the electron beam 34.

The stage mechanism (the sample holder) 3 consists of an XY stage 16, a wafer holder 17 (with a beam calibration pattern), and a retarding voltage source 19 for applying a negative voltage to the wafer 18. The XY stage 16 is provided with a position sensor based on the length measurement by a laser.

The wafer transportation system 4 consists of a wafer cassette 20 and a wafer loader 21. The wafer holder 17 travels between the wafer loader 21 and the XY stage 16 with a wafer 18 on it. The wafer loader 21 can be evacuated independently from an electron optics system 2 (i.e., an inspection chamber) such that the wafer is transported without causing the already evacuated electron optics system 2 to be brought to the atmospheric pressure.

The evacuation system 5 is generally composed of a rotary pump, a turbo-molecular pump, and an ion pump, though not shown in FIG. 1.

The optical microscope 6 is located inside the electron optics system 2. The XY stage 16 is used to move the wafer from the electron optics system 2 to the zone where the object can be observed through the optical microscope 6.

The control system 7 consists of: a signal detection system controller 22 for detecting signals from the detector 12, a blanking controller 23, a beam deflection controller 24, an electron optics system controller 25, a wafer height sensor system 26, a stage controller 27, and an energy filter controller 40. The control system 7 is programmed such that various conditions can be arbitrarily or selectively set according to different purposes. These conditions include an electron beam accelerating voltage, a deflection width, and a deflection speed, a time for picking up signals from the detector 12, a moving speed of the XY stage 16, and a voltage to be applied to the energy filter 36. The control system 7 also monitors for a position error or a height error on the XY stage 16 according to signals from the position sensor and the wafer height sensor 15 so as to generate a correction signal based on the result of monitoring to the controllers such that the electron beam is held focused correctly.

The control section 8 consists of a display 28 (which displays on its device operation screen a voltage contrast image, an optical image, and measured electrical characteristics), a computing section 29 which issues an instruction to an image processor or the control system 7, a storage 30 which stores voltage contrast image data and inspection data, a data input section 32 for data transmission with an external server 31, and a data converter 33.

Next, how an inspection is made using the inspection device as shown in FIG. 1 is described. First of all, the operator (inspector) places a wafer cassette 20, in which a wafer is on a desired shelf, in the wafer transportation system 4 of FIG. 1. The operator enters the number of the desired cassette shelf on the operation screen 28 to specify the wafer to be inspected. Then the operator enters various inspection condition parameters on the operation screen 28. The inspection condition parameters to be entered include an electron beam current, an electron beam energy, a field of view (FOV) for each screen and a retarding voltage. Though the operator can enter individual parameters one by one, usually the combinations of the above various inspection condition parameters are stored in a database as inspection condition data files in advance such that the operator has only to select one among these inspection condition data files which suits the target resistance or the target voltage range. This database is created as follows. When a resistance range is set, the beam current IP range is determined from the formula $0<\log(R \cdot IP)<3$ (where R represents the resistance to be measured; the beam current IP must be determined so as to satisfy this formula, as stated earlier). When a voltage range is set, the ranges for electrical fields and potentials in the wafer neighborhood and FOV are fixed. Once these parameters have been entered, the operator gives an instruction to start an inspection. In the automatic inspection mode, first the specified wafer 18 is carried into the inspection device 1. In the wafer transportation system 4, if the wafer 18 to be inspected has a different diameter or is of the orientation flat type or the notch type, the wafer holder 17 can be replaced with one which fits the size and shape of the wafer. The wafer 18 to be inspected is transported from the wafer cassette 20 onto the wafer holder 17 by the wafer loader 21 which includes an arm and a preliminary vacuum chamber. The wafer 18 is securely held before being evacuated inside the wafer loader 21 together with the holder then sent to the electron optics system which has already been evacuated by the evacuation system 5.

Once the wafer is loaded, electron beam irradiation conditions are set on various sections by the electron optics system controller 25 according to the above entered inspection condition parameters. Then, the stage 16 moves until (1) a first beam calibration pattern on the wafer holder 17 comes just beneath the electron optics system, (2) a voltage contrast image of the beam calibration pattern is obtained by the image processor, and (3) a focal/astigmatic adjustment is made through this contrast image. After reaching a specific point on the wafer 18, a voltage contrast image of the wafer 18 is obtained and contrasted, and other conditions are adjusted. If any of the electron beam irradiation conditions has to be altered, the beam can be re-calibrated. At the same time, the height of the wafer 18 is detected by the height sensor 15, and the relation between height information and electron beam focusing conditions is found by the wafer height detection system 26. It is not necessary to perform the full focusing operation each time a voltage contrast image is obtained, and the focusing conditions are automatically adjusted according to the result of wafer height detection. This obtains voltage contrast images with a high speed.

For the purpose of alignment, a special pattern prepared for alignment and various data such as optical microscopic images and voltage contrast images for alignment, and pattern position information should be prepared in advance. When the operator is going to enter inspection conditions, these data should be ready to be read out.

The wafer 18 in place is moved by the XY stage 16 toward the optical microscope 6 for observing a first coordinate system for alignment. An optical microscopic image of the alignment pattern on the wafer 18 is observed on the monitor 28 and compared with the pre-registered pattern image to calculate necessary position correction data for the first coordinate system. Then, the focus is shifted to a second coordinate system which is away from the first coordinate system by a given distance and includes a circuit pattern equivalent to that of the first coordinate system. Likewise, the optical microscopic image concerned is observed and compared with the pre-registered circuit pattern for alignment-to calculate position correction data for the second coordinate system and any rotational deviation from the first coordinate system.

After the above-mentioned preparatory steps including adjustments, corrections and inspection area setting have been finished, the XY stage moves to bring the wafer 18 underneath the electron optics system 2. Once the wafer 18 is set underneath the electron optics system 2, the same alignment procedure as the above-mentioned one is carried out by the optical microscope 6 using a voltage contrast image. This voltage contrast image is obtained as follows. Based on the corrected coordinate data which has been stored in the above-mentioned alignment procedure using the optical microscopic image, the same circuit pattern as observed via the optical microscope 6 is scanned and irradiated with the electron beam 34 two-dimensionally, or in the X and Y directions, by means of the deflector 14. As a result of this two-dimensional scan with the electron beam, emission electrons (including at least one of secondary electrons and back-scattering electrons) 35 from the to-be-observed area are detected by the above-mentioned structure such that a voltage contrast image is obtained. Since the inspection position check, the positioning and position adjustment as well as the rotational correction have already been carried out using an optical microscopic image as a simplified preparatory stage, positioning, position correction and rotational correction can be made with higher resolution, magnification and accuracy than when an optical image is used. As the wafer 18 is irradiated with the electron beam 34, the corresponding part of the wafer is electrically charged. One approach to avoid the influence of this charge during an inspection is to deduct the impact received by a circuit pattern outside the area to be inspected is chosen in advance as the circuit pattern to be irradiated with the electron beam 34 in the above-mentioned preparatory stage including position/rotational correction or inspection area setting. Another approach is that the control system 7 is arranged so as to allow automatic selection of an equivalent circuit pattern in a chip other than the chip to be inspected. Alternatively, a means for irradiation with ultraviolet rays may be used to ease the charge. When any of these measures is used, irradiation with the electron beam 34 in the preparatory stage would not affect the image being inspected during inspection work.

The result of this alignment is transmitted to the controllers such that in an actual inspection process, the controllers make rotational corrections or position coordinate corrections.

After the alignment has been completed, the focus is shifted to the second calibration pattern placed on the sample holder 17. The second calibration pattern is used to make the signal scale in FIG. 4 agree with the signal of the voltage contrast image obtained in an inspection. The pattern includes via (or contact) holes with sufficiently low resistances and via (or contact) holes with sufficiently high resistances. Using a voltage contrast image of that pattern, a calibration is made of the signal data for the sufficiently low and high resistance portions. An insulated portion having no pattern may be used as a sufficiently high resistance portion. Based on the result of this calibration, the focus is shifted onto the wafer 18 to obtain a voltage contrast image of the pattern on the wafer and to perform a brightness control or calibration.

Figure 8:
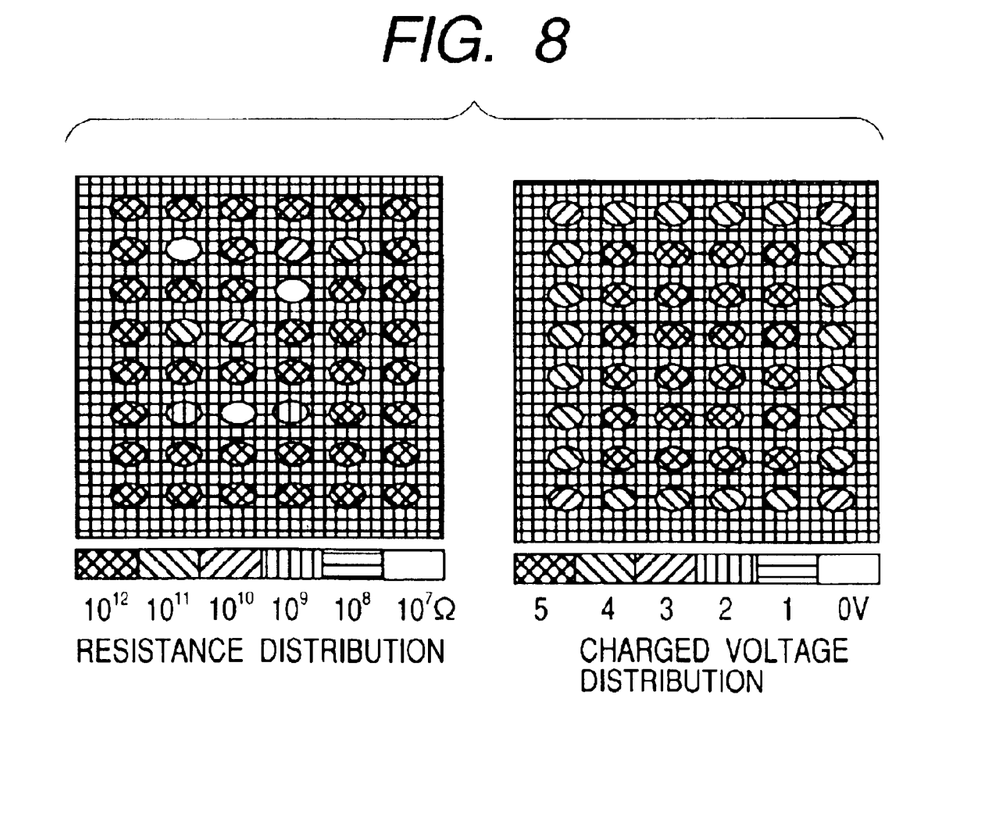
FIG. 8 shows the resistance distribution and the charged voltage distribution of via (or contact) holes according to a first embodiment of the present invention.
Figure 9:
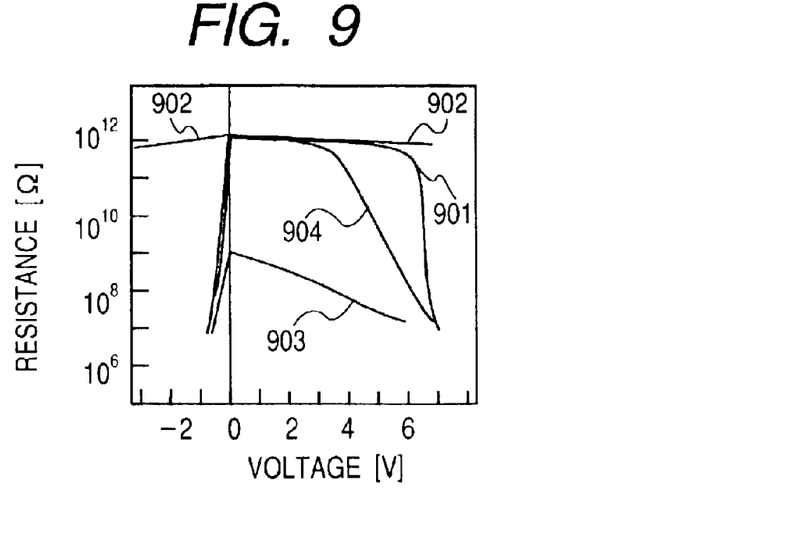
FIG. 9 shows the voltage dependency of the resistance of via (or contact) holes according to the first embodiment of the present invention.

After this calibration has been completed, an inspection starts according to the electron irradiation conditions pre-entered in the control system 7. In FIG. 8, the graph on the left shows a via (or contact) hole resistance distribution as calculated from the signal of the voltage contrast image thus obtained based on FIG. 4, and the graph on the right shows a distribution of via (or contact) hole charged voltages measured through the energy filter. The charged voltage measurement procedure is described below. In this case, the energy filter is used for measuring the charged voltage. The wafer (sample) (on which an electronic device is formed) is irradiated with the primary electron beam, and the energy of secondary electrons or back scattering electrons which are emitted from the wafer is measured. The energy value varies by the amount equivalent to the voltage applied to the electronic device in the sample's area irradiated with the primary electrons so as to calculate the voltage concerned. In our experiment, such an image was obtained each time the beam current, the beam energy, the FOV or the distribution of potentials between the wafer and the electrode around the wafer was changed such that the voltage dependency of the resistance of each via (or contact) hole is calculated. As a consequence, the via (or contact) hole resistances were roughly classified into three types (result 901, result 902, result 903), as shown in FIG. 9. In case of the result 901, the resistance-voltage characteristics equal to those predicted from impurity doping conditions, from which the PN junction was found. For the result 902, the resistances were high on both the forward bias and reverse bias sides which suggest the presence of an incomplete contact defect. For the result 903, the resistances were very low, which shows that a leakage defect existed. From the result 904 it was found that the breakdown voltage was low and a leakage defect might arise in the future, though the situation seemed normal at a glance because the resistances were high on the reverse bias side. In addition, from these resistance-voltage characteristics, it becomes possible to predict where a defect occurs during the impurity doping process. These results would not have been obtained if resistances for a rather wide range of voltages had not been measured.

A method for moving to the next inspection area may be one of the following two methods. The first method is that the scanning zone of the electron beam 34 is moved while the XY stage 16 remains stationery. The second method is that the XY stage 16 is moved. For inspection of a specific and relatively small area, the former method (the stage remains stationery) is preferred. For inspection of a relatively wide area, the latter method (the stage is moved) is preferred. If blanking the electron beam 34 is needed to shift the inspection area, the electron beam 34 is deflected by the blanking deflector 13 so as not to irradiate the wafer.

Figure 10:
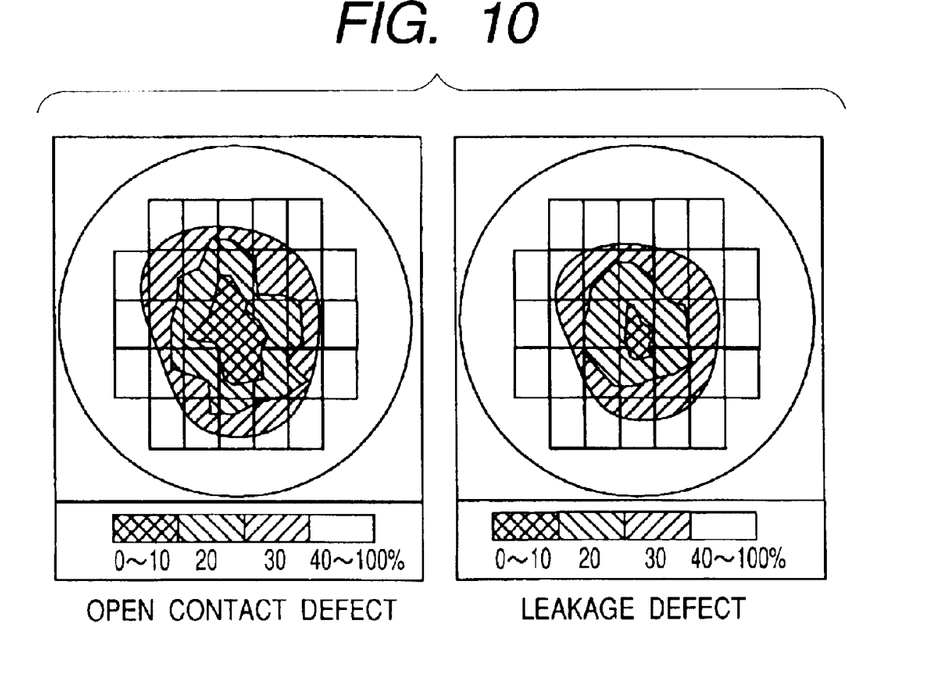
FIG. 10 shows the distributions of the incomplete contact defect densities and the leakage defect densities in the wafer according to the first embodiment.

While the specific area is being inspected in this way, image processing takes place in real time to measure the voltage dependency of resistance. Then, the inspection results are displayed on the operation monitor 28 and the data is outputted through the data converter 33 externally. After the wafer has been fully or partially inspected in this way, an incomplete contact defect distribution and a leakage defect distribution like the ones shown in FIG. 10 can be acquired. Finally, the wafer is unloaded to finish the inspection process.

In this case, the beam irradiation area, the beam energy, the distribution of potentials between the wafer and the electrode around the wafer were varied in order to vary the charged voltage. Otherwise, the charged voltage can be varied by irradiating a wide area with the electron beam. Also, although this embodiment uses an electron beam in order to charge the wafer surface electrically, similar measurement can be made using an ion beam instead.

Embodiment 2

According to the second embodiment, the resistance of each electronic device at a desired charged voltage is measured using the inspection device according to the first embodiment. If the measured resistance value is different from a predetermined value, the part in question is regarded as a defect, and the position of that defective part is displayed. The charged voltage control is performed as follows. The information on the charged voltage measured using the energy filter 36 is sent to the computing section 29 where the electron beam irradiation conditions for attaining the desired charged voltage are determined. This information is sent to the control system 7. If the desired charged voltage is not attained due to a failure in properly setting electron beam irradiation conditions, the same procedure is repeated. A detailed description of the inspection device is omitted here as the device is detailed in the explanation of the first embodiment.

Figure 11:
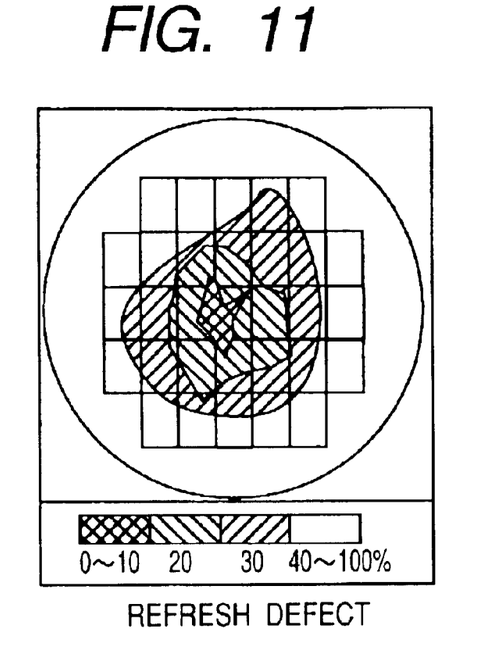
FIG. 11 shows the distribution of the refresh defect densities in the wafer according to a second embodiment of the present invention.

This procedure can be used to inspect for refresh defects in PN junctions constituting a DRAM. We assumed that if such a PN junction has a resistance of below $10^{14}$ ohms when 3 V is applied, it is considered a defect. We inspected a wafer with via (or contact) holes each having a PN junction at the bottom following the above-mentioned procedure and calculated their resistances at a charged voltage of 3 V. Assuming that a via (or contact) hole whose resistance is found to be below $10^{14}$ ohms is a refresh defect, we mapped out a defect density distribution in the wafer as shown in FIG. 11.

Embodiment 3

Figure 12:
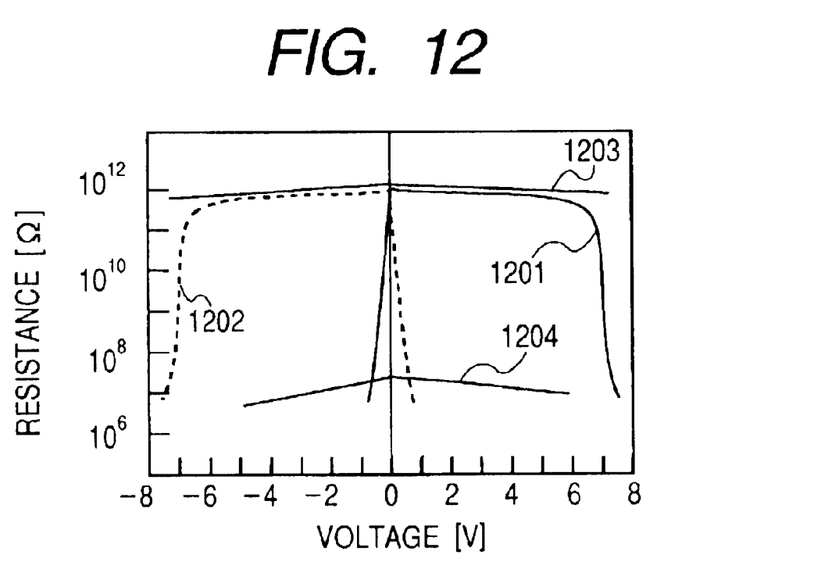
FIG. 12 shows the voltage dependency of the resistance of via (or contact) holes according to a third embodiment of the present invention.
Figure 13:
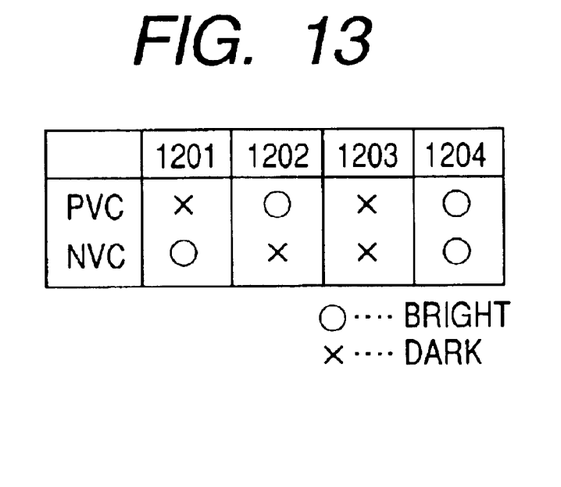
FIG. 13 shows the charged voltage dependency of a voltage contrast image signals according to the third embodiment of the present invention

According to the third embodiment, we conducted an inspection of PN junctions of a CMOS formed on a wafer using the inspection device according to the first embodiment. By measuring the resistance-voltage characteristics, we could identify the orientation of PN junctions, incomplete contact defects, and leakage defects. The inspection results are shown in FIG. 12. Here, numeral 1201 designates a PN junction in which the wafer surface is an n-diffusion layer. Numeral 1202 designates a PN junction in which the wafer surface is a p-diffusion layer. Numeral 1203 designates an incomplete contact defect, and numeral 1204 designates a leakage defect. Furthermore, when inspection conditions which do not cause a breakdown are maintained by controlling the charged voltage, a judgment of inspection results can be made simply by checking variations in voltage contrast image signals (NVC and PVC). The results are shown in FIG. 13.

Embodiment 4

The fourth embodiment uses the device according to the first embodiment. It concerns an inspection method or device by which a voltage contrast image signal for an electronic device whose resistance is known is obtained while or before a voltage contrast image signal for inspection is obtained, and a calibration is made concerning relations between voltage contrast image signals and resistances.

Figure 14:
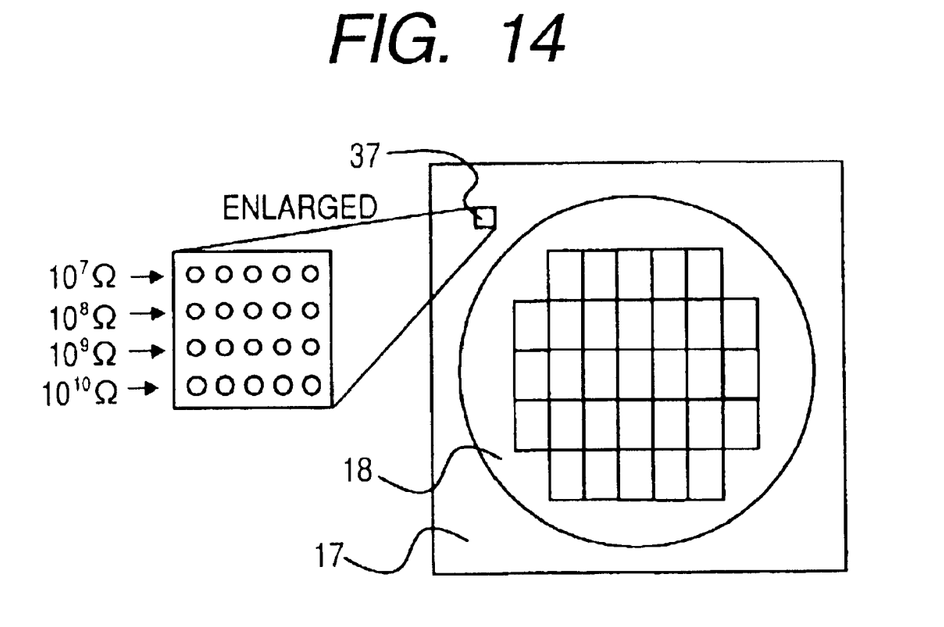
FIG. 14 shows a sample holder with a standard resistance sample used in a fourth embodiment of the present invention.

The inspection procedure is as follows. First, the wafer 18 to be inspected is loaded in the inspection device and electron beam irradiation conditions are set using previously registered parameters. A standard sample 37 whose resistance is known is stuck on the sample holder 17 as shown in FIG. 14. Before starting an inspection, a voltage contrast image of the standard sample is obtained to find the relation between electric resistances and voltage contrast image signals. After that, inspection is started and the resistance is calculated from the obtained voltage contrast image using the relation-data. This method makes it possible to measure resistances with higher accuracy.

Embodiment 5

The fifth embodiment uses the inspection device according to the first embodiment. In this embodiment, a charge voltage control electrode 38 is installed in front of the wafer 18 in order to vary the charged voltage. As illustrated in FIG. 15, a voltage can be applied to this charge control electrode. When voltages Vcc are applied to the wafer, the resultant charged voltages are as shown in FIG. 16. This graph indicates that the charged voltage can be continuously varied from positive to negative and vice versa easily. For quicker charged voltage variation, it is effective to apply a magnetic field to the wafer vertically.

Embodiment 6

The sixth embodiment uses the inspection device according to the first embodiment in order to detect defects by comparison checking. Before applying the methods of the above-mentioned embodiments, the voltage contrast images of the devices are compared with the voltage contrast image of a model device for screening potential defective devices. Then the methods of the above-mentioned embodiments are applied to confirm the defective devices. Alternatively, the devices are compared in groups by area to reduce inspection time. For example, in the first area, the resistance of each electronic device at a desired charged voltage is measured or the resistances of each electronic device over a desired range of charged voltages are measured. Then, resistance measurements are made similarly in a second area as well. Comparison is made between the resistances obtained in the first area and those in the second area to detect a difference. Such a difference is thought to indicate a defect.

The present invention is summarized from the above-mentioned embodiments as follows.

According to a first aspect of the present invention, an inspection method comprises the steps of: scanning a specific area on a to-be-inspected object with a charged particle beam; measuring at least one of secondary electrons and back scattering electrons emitted from the specific area; calculating a charged voltage of the specific area based upon the measured result, and calculating a corresponding electric resistance value based upon the measured result and an electric current value of the charged particle beam; and comparing a charged voltage vs. electric resistance characteristic pattern of the to-be-tested object being composed of the changed voltage and the corresponding electric resistance value with a charged voltage vs. electric resistance characteristic pattern of at least one type of defect to determine whether the type of defect exists in the specific area.

The inspection purpose is achieved by carrying out all these steps each time the charged particle beam irradiation conditions are altered, and thus finding the electronic device's resistance-voltage relation. Here, the charged particle beam irradiation condition parameters are beam current, beam energy, irradiation area, and distribution of electric potentials between the wafer and the electrode around the wafer. The irradiation conditions can be altered by altering one or more parameters among them. Besides, a voltage contrast image can be detected accurately by continuing the above-mentioned scan until the charged condition is stabilized. Further, the purpose is achieved by taking a preliminary step of storing a signal for making a voltage contrast image, in which an area wider than the area for obtaining the voltage contrast image signal is scanned and charged with the charged particle beam.

Here, resistance values can be measured by carrying out calibration with a voltage contrast image of an electronic device whose resistance-voltage relation is known, and the results of the above resistance measurements are used to identify the type of defect on the substrate. The above procedure provides an inspection method to check the junction orientation, presence of any leakage defect or incomplete contact defect in an electronic device having PN junctions, where a voltage contrast image is obtained under a positively or negatively charged condition. In this inspection method, the charged particle beam is an electron beam. Here, the beam current IP employed is within the range of 0<log (R·IP)<3, where R represents the to-be-measured electric resistance.

According to a second aspect of the present invention, an inspection device using a charged particle beam comprises: deciding means for deciding irradiation conditions of a charged particle beam which include an electric current value of the charged particle beam; scanning means for scanning a specific area on a to-be-inspected object with the charged particle beam; measuring means for measuring an electron count and an energy level of at least one of secondary electrons and back scattering electrons emitted from the specific area; calculation means for calculating a charged voltage of the specific area based upon the energy level, and for calculating a corresponding electric resistance value based upon the electron count and the electric current value of the charged particle beam; and comparing means for comparing a charged voltage vs. electric resistance characteristic pattern of the to-be-tested object being composed of the changed voltage and the corresponding electric resistance value with the charged voltage vs. electric resistance characteristic pattern of the type of defect to determine whether the type of defect exists in the specific area.

In order to vary the charged voltage, a charged voltage control electrode to which a voltage can be applied is provided in front of the wafer. The charged voltage can be varied at high speed by applying a magnetic field to the wafer vertically.

Typical effects of the present invention will be briefly described below. When a partially finished substrate of a semiconductor device having a circuit pattern is inspected with the inspection method or device according to the present invention, it is possible to measure electric resistances of small portions at desired voltages and the voltage dependency of the electric resistance in a non-contact manner, which is impossible by any conventional inspection device. The inspection result thus obtained can be used to identify the types of defects. If this inspection method is applied to the PCB manufacturing process, defects can be detected and remedied at an early stage of the manufacturing process. As a consequence, during the manufacturing of semiconductor devices and other PCB related devices, the fraction defects are decreased and the productivity is increased. Therefore, since the defect occurrence rate is reduced, the reliability of semiconductor devices, etc. is increased, and the efficiency in development of new products is improved so as to reduce manufacturing cost.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A semiconductor defect inspection device, comprising:

deciding means for deciding irradiation conditions of a charged particle beam which include an electric current value of the charged particle beam;

scanning means for scanning a specific area on a to-be-inspected object with the charged particle beam;

measuring means for measuring an electron count and an energy level of at least one of secondary electrons and back scattering electrons emitted from the specific area;

calculation means for calculating a charged voltage of the specific area based upon the energy level, and for calculating a corresponding electric resistance value based upon the electron count and the electric current value of the charged particle beam; and comparing means for comparing a charged voltage vs. electric resistance characteristic pattern of the to-be-tested object being composed of the changed voltage and the corresponding electric resistance value with the charged voltage vs. electric resistance characteristic pattern of said type of defect to determine whether said type of defect exists in the specific area.

2. The semiconductor defect inspection device according to claim 1, further comprising:

an image processing section for making a voltage contrast image based upon scanned results from the scanning means by scanning a plurality of areas on the to-be-tested object with the charged particle beam and measured results from the measuring means by measuring an electron count and an energy level of at least one of secondary electrons and back scattering electrons emitted from each of the plurality of areas; and preliminary defect determining means for comparing a brightness of each area in the voltage contrast image thereby preliminarily determining at least one specific area containing at least one defect.

3. The semiconductor defect inspection device according to claim 2, further comprising calibrating means for calibrating a signal scale of the voltage contrast image with the charged voltage vs. electric resistance characteristic pattern of at least one type of defect.

4. The semiconductor defect inspection device according to claim 1, further comprising:

a holder for holding a to-be-inspected object; and a detector for detecting at least one of secondary electrons and back scattering electrons emitted from the specific area, wherein the scanning means includes an objective lens.

5. The semiconductor defect inspection device according to claim 4, further comprising at least one of a position calibration pattern on the holder, an optical image, and a voltage contrast image, for aligning the holder with the scanning means.

6. The semiconductor defect inspection device according to claim 1, wherein the measuring section includes an electrode for varying the charged voltage by applying a voltage to the surface of the object.

7. The semiconductor defect inspection device according to claim 1, wherein the object is a wafer bearing at least one semiconductor device.

* * * * *